(12) United States Patent
Capasso et al.

(10) Patent No.: US 8,351,481 B2
(45) Date of Patent: Jan. 8, 2013

(54) METHODS AND APPARATUS FOR SINGLE-MODE SELECTION IN QUANTUM CASCADE LASERS

(75) Inventors: Federico Capasso, Cambridge, MA (US); Benjamin G. Lee, Toronto (CA); Christian Pflugl, Cambridge, MA (US); Laurent Diehl, Cambridge, MA (US); Mikhail A. Belkin, Austin, TX (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 13/126,576

(22) PCT Filed: Nov. 5, 2009

(86) PCT No.: PCT/US2009/005982
§ 371 (c)(1),
(2), (4) Date: Sep. 12, 2011

(87) PCT Pub. No.: WO2010/059180
PCT Pub. Date: May 27, 2010

(65) Prior Publication Data
US 2011/0310915 A1 Dec. 22, 2011

Related U.S. Application Data

(60) Provisional application No. 61/112,260, filed on Nov. 7, 2008.

(51) Int. Cl.
*H01S 3/08* (2006.01)

(52) U.S. Cl. ........ 372/96; 372/92; 372/50.11; 372/50.1; 372/45.01; 372/43.01; 372/19

(58) Field of Classification Search ................ 372/96, 372/92, 50.11, 50.1, 45.01, 43.01, 19
See application file for complete search history.

(56) References Cited

U.S. PATENT DOCUMENTS 6,137,817 A * 10/2000 Baillargeon et al. ....... 372/45.01
2009/0206242 A1 * 8/2009 Mizaikoff et al. ....... 250/227.11

* cited by examiner

*Primary Examiner* — Kinam Park
(74) *Attorney, Agent, or Firm* — Wolf, Greenfield & Sacks, P.C.

(57) ABSTRACT

Methods and apparatus for improved single-mode selection in a quantum cascade laser. In one example, a distributed feedback grating incorporates both index-coupling and loss-coupling components. The loss-coupling component facilitates selection of one mode from two possible emission modes by periodically incorporating a thin layer of "lossy" semiconductor material on top of the active region to introduce a sufficiently large loss difference between the two modes. The lossy layer is doped to a level sufficient to induce considerable free-carrier absorption losses for one of the two modes while allowing sufficient gain for the other of the two modes. In alternative implementations, the highly-doped layer may be replaced by other low-dimensional structures such as quantum wells, quantum wires, and quantum dots with significant engineered intraband absorption to selectively increase the free-carrier absorption losses for one of multiple possible modes so as to facilitate single-mode operation.

20 Claims, 9 Drawing Sheets

METHODS AND APPARATUS FOR SINGLE-MODE SELECTION IN QUANTUM CASCADE LASERS

GOVERNMENT SPONSORED RESEARCH

Some of the research relating to the subject matter disclosed herein was sponsored by U.S. government grant HR0011-04-1-0032 awarded by the Defense Advanced Research Projects Agency (DARPA), and the U.S. government has certain rights to at least some disclosed subject matter.

BACKGROUND

Quantum Cascade Lasers (QCLs) are unipolar semiconductor lasers that utilize optical transitions between confined electronic sub-bands (e.g., conduction or valence bands) of semiconductor hetero structures. Reliable operation of QCLs in the 3-24 μm wavelength range has been achieved although further improvements may be possible. In continuous wave operation at room temperature, QCLs achieve output powers exceeding 1 W and can be designed with broadband gain and with full width at half maximum (FWHM) of at least 300 $cm^{-1}$, enabling wide wavelength tunability.

QCLs operate in the mid-infrared or terahertz spectral regions giving rise to a wealth of applications. For example, a QCL operating in the mid-infrared region may be used for sensing and analyzing of chemical and biological agents, as many gas- and liquid-phase chemicals have characteristic absorption features in the mid-infrared region. Thus, detectors incorporating QCLs may be used to identify such chemical or biological agents. Some exemplary applications of QCLs in chemical sensing include medical diagnostics, such as breath analysis, pollution monitoring, environmental sensing of the greenhouse gases responsible for global warming, and remote detection of toxic chemicals and explosives.

SUMMARY

Ensuring reliable and predictable single-mode selection of QCLs is important for a variety of applications such as chemical sensing, which require the generation of radiation at a single lasing frequency. Single-mode operation can be achieved by processing QCLs as distributed feedback (DFB) lasers. The inventors have recognized and appreciated that the single-mode selection of QCLs may be improved by designing such lasers to enable an independent manipulation of their index-coupling and loss-coupling components. Accordingly, some embodiments of the invention are directed to a multilayer structure forming an optical waveguide in which at least one component of the multilayer structure is designed to selectively absorb radiation, due to the presence of free carriers, in at least one of the frequency modes propagated in the optical waveguide. The selective free carrier absorption results in a differential loss for multiple frequency modes present in the optical waveguide. By attenuating some frequency modes more than others, a QCL with improved single-mode selection may be obtained.

In a conventional DFB-QCL, a distributed feedback grating is formed in proximity to an active core region of the waveguide. The grating may comprise a series of repeat units to support lasing in at least two different frequency modes separated by a photonic gap. Typically, the particular mode that ultimately constitutes laser emission is influenced by the position of end mirrors in relation to the grating. In practice, the end mirror positions are typically arbitrary with respect to the grating, which results in the selection of either (or both) of the lasing modes. The inventors have recognized and appreciated that modifications to the free carrier absorption characteristics of semiconductor materials used to form portions of each repeat unit may allow for selective lasing at a single and predictable frequency mode in a waveguide containing at least two modes separated by a photonic gap. For example, increasing the concentration of doping in a first region may increase the loss experienced by a frequency mode which is predominant in the first region (i.e., on one side of the photonic gap), whereas a frequency mode which is predominant in a second region (i.e., the mode on the other side of the photonic gap) may be less affected by the increase in free carrier absorption caused by the increased doping in the first region.

A design of a conventional distributed feedback grating in QCLs involves etching a grating in a thin layer of semiconductor material on top of the active region of the laser, followed by the conformal re-growth of a semiconductor material with a slightly different refractive index. In order to keep the waveguide losses low, semiconductor layers involved in DFB grating designs are typically low-doped semiconductor materials (e.g., having a doping density less than $10^{17}$ $cm^{-3}$). The use of low-doped semiconductor materials results in a low-loss DFB-QCL waveguide, which is desired for good laser performance.

The difference in refractive index between the two semiconductor layers in the grating produces index-coupling which provides for laser-mode selection in DFB-QCLs. In an idealized device in which the reflectivity of the ends of the laser cavity can be ignored, a DFB grating with pure index coupling (i.e., without a loss-coupling component) results in the selection of two laser modes with identical lasing threshold on either side of the grating's photonic gap. In practice, the lasing mode selection is affected by the positions of the end mirrors relative to the DFB grating. As described above, in general, the mirror positions are arbitrary with respect to the DFB grating and either (or both) of the two laser modes, supported by the index-coupled DFB grating, is randomly selected as the lasing mode.

One method for selecting a single mode of emission in a DFB-QCL is to introduce gain- or loss-coupling in the laser. Gain and loss-coupling is also useful for maintaining good single-mode selection when reflections from end mirrors are present in the QCL. The coupling coefficient of a grating may be represented as:

$$\kappa = \pi \Delta n / \lambda_0 + \Delta \alpha / 2,$$

where $\Delta n$ is a periodic variation in refractive index of the grating (i.e., resulting in index-coupling), $\lambda_0$ is the wavelength in the medium, and $\Delta \alpha$ is a periodic variation in the loss or gain (i.e., resulting in gain/loss coupling). A QCL incorporating a grating with both index- and loss-coupling is said to be a complex-coupled DFB-QCL. The inventors have recognized and appreciated that single-mode selection in a DFB-QCL may be improved by allowing the index- and loss-coupling terms of the grating to be independently controlled in the QCL fabrication.

The inventors have further recognized and appreciated, however, that a tradeoff exists when manipulating loss-coupling in a DFB-QCL. For example, in order to obtain effective single-mode selection, it is advantageous to have sufficient loss to differentiate the losses of the two modes, even with arbitrary end mirror positions in the laser cavity. However, it is also important to keep the total loss for the desired lasing mode to a minimum. Laser operation can be compromised if the total loss for the desired lasing mode is too large, resulting in a high threshold for lasing, lower output power, or no lasing at all.

In view of the foregoing, methods and apparatus according to various inventive embodiments described herein are directed to the design and fabrication of a complex-coupled DFB grating in QCLs where both the index- and the loss-coupling components are independently controlled. Moreover, inventive embodiments according to the present disclosure enable the introduction of sufficient loss-coupling for reliable and predictable single-mode selection, while maintaining a low overall loss for the desired lasing mode. Although various embodiments described below refer to use of the DFB grating with quantum cascade lasers, it should be appreciated that aspects of the embodiments may be applied to other semiconductor lasers emitting in the mid-infrared or terahertz spectral regions.

In sum, one embodiment of the present invention is directed to a distributed-feedback quantum cascade laser (DFB-QCL) comprising an active region to provide amplification of first radiation over a first range of wavelengths. The DFB-QCL further comprises a distributed-feedback grating disposed on the active region to provide a spatial variation of free-carrier absorption loss such that the distributed-feedback quantum cascade laser supports substantially only a single mode of radiation emission.

Another embodiment of the present invention is directed to a method for providing single-mode radiation emission. The method comprises providing a spatial variation of free-carrier absorption loss in a quantum cascade laser such that the quantum cascade laser supports substantially only a single mode of radiation emission. In one aspect of this embodiment, the method may comprise disposing a distributed-feedback grating on an active region of a quantum cascade laser. In another aspect, the distributed-feedback grating comprises at least two semiconductor materials having different doping levels. In yet another aspect, one of the at least two semiconductor materials with a higher doping level provides the spatial variation in free-carrier absorption loss.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The drawings are not necessarily to scale, emphasis instead generally being placed upon illustrating the principles of the invention.

DETAILED DESCRIPTION

Following below are more detailed descriptions of various concepts related to, and embodiments of, inventive methods and apparatus according to the present disclosure for single-mode selection in quantum cascade lasers. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes only.

Figure 1:
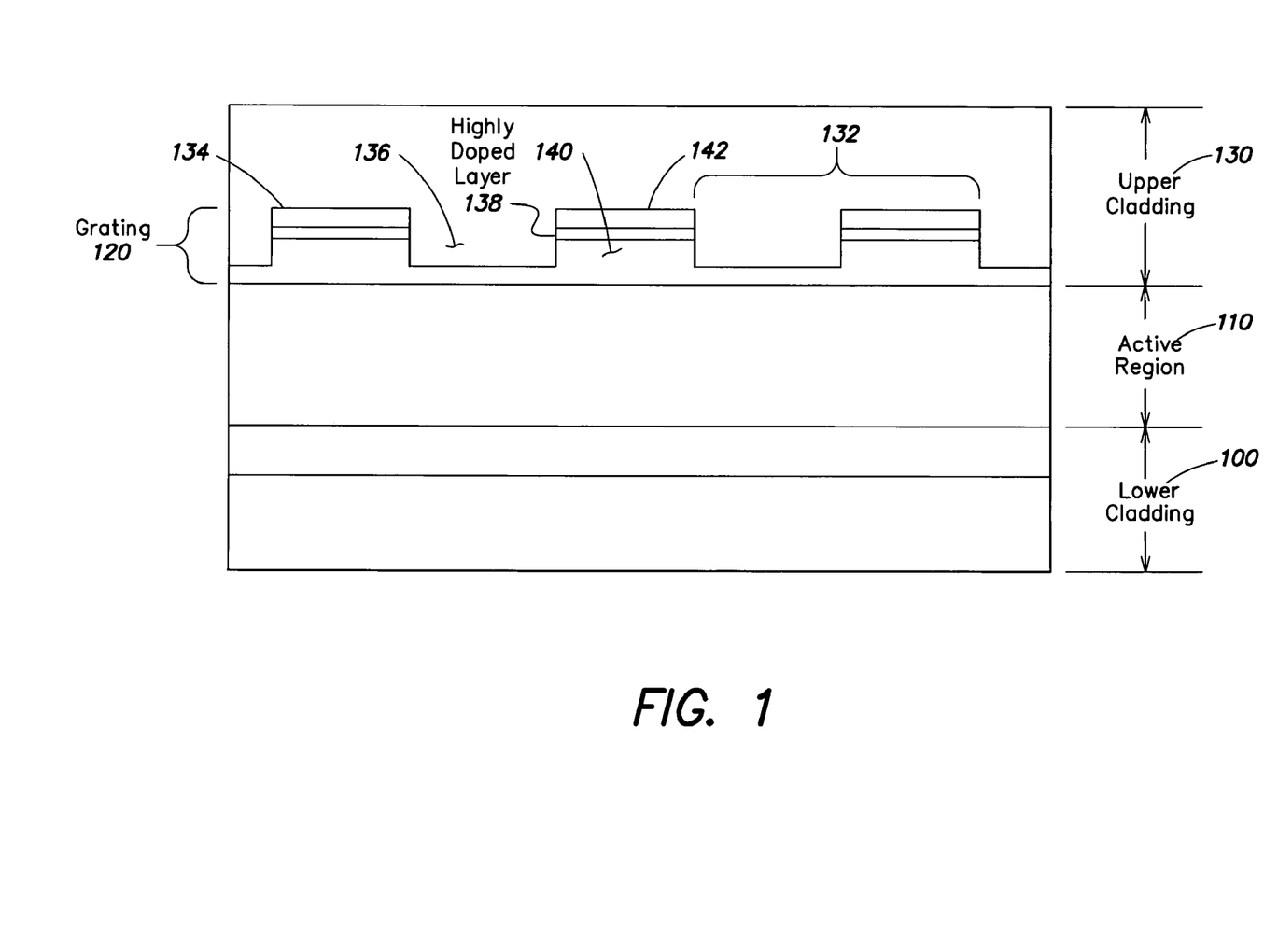
FIG. 1 shows a DFB-QCL structure in accordance with some embodiments of the invention.

FIG. 1 illustrates an example of a complex-coupled buried grating design as part of a multi-layer DFB-QCL structure according to some embodiments of the invention. The multi-layer structure comprises a lower cladding 100, an active region 110, a grating 120, and an upper cladding 130 which is formed adjacent to the grating 120. The grating 120 comprises a plurality of repeat units 132 which provide both loss-coupling and index-coupling. Each repeat unit 132 comprises two regions which differ in their loss, e.g., a repeat unit comprises a ridge 134 and a groove 136. The presence of a highly-doped semiconductor layer 138 in one of the two regions (134, 136) results in increased losses due to free-carrier absorption, while the other region (e.g., without a highly doped layer) experiences lower losses.

When a semiconductor material is doped so that the concentration of free carriers is large enough to make the plasma wavelength of the material comparable to the laser wavelength (e.g., a doping concentration of $10^{18}$ cm$^{-3}$ in the mid-infrared range), significant free-carrier absorption occurs in the material. The effect of free-carrier absorption is larger for longer wavelengths, and a suitable range of wavelengths for which embodiments of the invention may operate to provide sufficient free-carrier absorption is in the mid-infrared and terahertz regions (e.g., 3-200 μm). In contrast, the intrinsic absorption of semiconductor materials (InP, InGaAs, GaAs, etc.) is in the visible and near-infrared spectral region (e.g., below 3 μm). Alternatively, in some embodiments, structures other than a highly-doped semiconductor layer may be used to increase free-carrier absorption, such as structures with an engineered strong intraband absorption (e.g., doped quantum wells, quantum wires, and quantum dots).

In addition to providing loss-coupling, the two regions 134, 136 of each repeat unit 132 also provide index-coupling by having a different refractive index, as in conventional index-coupled DFB lasers. The repeat units 132 are arranged so that they extend along the entire length of the laser cavity where loss- and index-coupled distributed feedback are desired.

The inventors have recognized and appreciated that of the two DFB modes on either side of the photonic gap, one mode has a significant electric field overlap with the lossy part of the grating (e.g., the region containing the highly-doped layer), while the other mode has minimal overlap with the lossy part of the grating. This spatial differentiation between the modes in the waveguide enhances the loss of the former mode due to free-carrier absorption while not substantially affecting the waveguide loss of the latter mode. Thus, embodiments of the present invention are designed to differentiate between the modes and select the latter one (i.e., the mode with lower losses) as the desired lasing mode. Additionally, waveguide losses caused by the lossy material are reduced for the desired lasing mode.

In one exemplary embodiment, a multi-layer DFB-QCL structure comprises a lower cladding 100 comprising 4 μm of doped InP (doping concentration: $10^{17}$ cm$^{-3}$) and 200 nm of doped InGaAs (doping concentration: $3*10^{16}$ cm$^{-3}$). The DFB-QCL also comprises an active region 110 comprising twenty periods of a bound-to-continuum design for emission at 9.6 μm, a 100 nm doped InGaAs layer (doping concentration: $3*10^{16}$ cm$^{-3}$) as a spacer, and twenty periods of a bound-to-continuum design for emission at 8.4 μm. Although the active region design described above is one example of a suitable active region 110 for use with embodiments of the invention, it should be appreciated that in general, any quantum cascade laser or infrared semiconductor laser active region could alternatively be used.

In the exemplary embodiment described above, and with reference to FIG. 1, the complex-coupled buried grating 120 comprises three layers. A first layer 140 comprises 200 nm of doped InGaAs (doping concentration: $3*10^{16}$ cm$^{-3}$). A second layer 138 disposed on top of the first layer comprises 200 nm of highly-doped InGaAs (e.g., doping concentration: $1*10^{18}$ cm$^{-3}$) as a lossy material for loss-coupling. A third layer 142 disposed on top of the second layer 138 is similar in composition to the first layer 140 and comprises 200 nm of doped InGaAs (doping concentration: $3*10^{16}$ cm$^{-3}$). In some embodiments of the invention, grooves 136 are etched into the layers of the grating 120, followed by deposition of doped InP (doping concentration: $10^{17}$ cm$^{-3}$) to form the upper cladding 130. The upper cladding 130 additionally comprises 500 nm of highly-doped InP (doping concentration: $5*10^{18}$ cm$^{-3}$) disposed on the low-doped InP as a contact layer on which metal electrical contacts may be deposited. In an exemplary embodiment, the grooves 136 may be 500 nm deep and the duty cycle of the grating 120 may be 50%.

Although the exemplary embodiment of FIG. 1, as described above, comprises substantially low-doped InP for the lower cladding and upper cladding layers and alternating layers of low- and high-doped InGaAs for the grating, it should be appreciated that other embodiments may not comprise two different semiconductor materials (e.g., InP and InGaAs), but rather may comprise only low- and high-doped versions of the same semiconductor material (e.g., low- and high-doped InP).

The period of the grating 120 (i.e., the length of one repeat unit) fixes the emission frequency of the laser mode supported by it, according to the Bragg formula for a first-order grating:

$$2\Lambda n_{eff} = \lambda,$$

where $\Lambda$ is the grating period, $n_{eff}$ is the effective index of the laser mode, and $\lambda$ is the free-space wavelength of the laser mode.

The presence of a lossy, highly-doped semiconductor layer in one region of the grating 120 provides loss-coupling for the DFB, due to the difference in loss between the highly-doped material 138 and the upper cladding layer 130 in each repeat unit 132 of the grating 120. The low-doped layers 140, 142 in the grating 120 provide index-coupling for the DFB, due to the differences in refractive index contrast between the material in the low-doped layers 140, 142 (e.g., InGaAs) and the material in the upper cladding 130 (e.g., InP) in each repeat unit 132 of the grating 120.

The inventors have recognized and appreciated that embodiments of the invention provide a flexible design framework wherein the index- and loss-coupling components of the DFB can be modulated almost independently by changing one or more design parameters of the DFB grating. In one aspect, changing the thicknesses of the highly-doped grating layer 138 and/or the low-doped grating layers 140, 142 affects the losses experienced by the different modes in the waveguide. For example, increasing the thickness of the highly-doped layer 138 results in an increase in loss-coupling, but also increases the total waveguide losses. Similarly, increasing the doping concentration of the highly-doped layer 138 also results in an increase in loss-coupling and greater overall waveguide losses. Additionally, increasing the doping concentration of the highly-doped layer 138 also changes the refractive index of this layer, which in turn changes the index-coupling slightly. However, this effect is generally small and is compensated in some embodiments by a corresponding change in the thicknesses of the low-doped layers 140, 142 that provide index-coupling.

Fabrication

Some embodiments of the invention may be fabricated using standard QCL growth and lithographic techniques. Steps in an exemplary method for fabricating the DFB-QCL shown in FIG. 1 are illustrated in FIGS. 2a-2c.

Figure 2A:
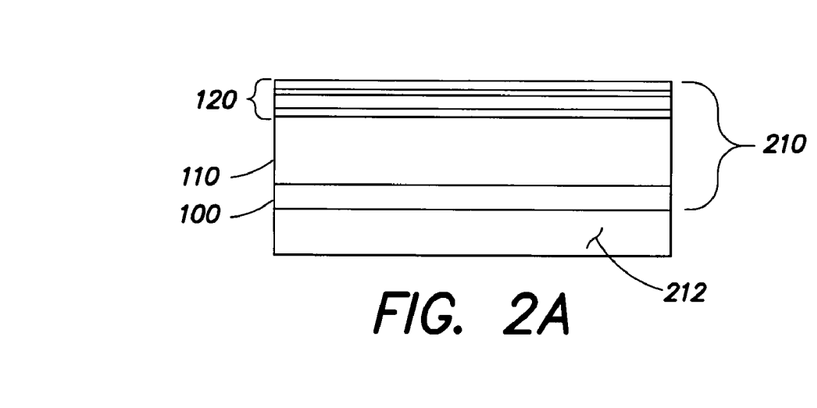
FIG. 2 illustrates a sequence of fabrication steps that may be used to produce the structure illustrated in FIG. 1.
Figure 2B:
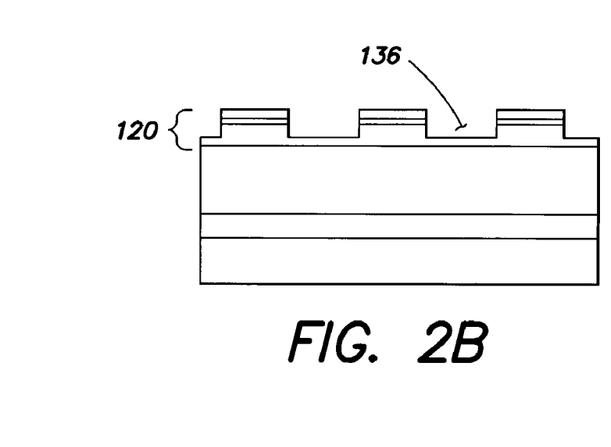

In a first step, shown in FIG. 2a, a technique such as metal-organic vapor phase epitaxy (MOVPE) or molecular beam epitaxy (MBE) may be used to grow a layer structure 210 on top of a substrate 212, for example a wafer of highly-doped InP. In one exemplary embodiment, the growth sequence comprises growing some of the layers illustrated in FIG. 1 and discussed above, including a lower cladding 100, an active region 110, and the three layers for the grating 120. It should be appreciated that active regions 110 with different designs (e.g., other QCL designs or other mid-infrared laser designs) may alternatively be used and the non-limiting examples of FIGS. 1 and 2 are merely intended to be illustrative.

In some embodiments, after forming the multi-layer structure illustrated in FIG. 2a, standard lithographic techniques may be used to expose a periodic grating pattern onto the surface of the multi-layer structure and etch grooves 136 into the top layers of the grating 120. For example, 500 nm deep grooves may be etched in the grating 120 with a duty cycle of 50% as shown in FIG. 2b.

Figure 2C:
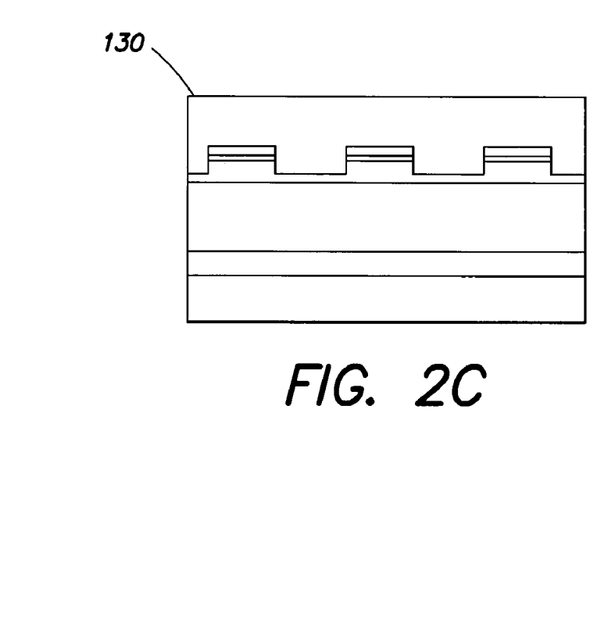

In a next step illustrated in FIG. 2c, an upper cladding layer 130 may be grown using MOVPE or MBE after etching the grooves 136 in the grating. As described above, any suitable materials may be used for any of the layers of the multi-layer DFB-QCL, and the aforementioned exemplary thicknesses and compositions of the layers are provided merely for illustration.

Modes of a DFB-QCL

The DFB-QCL structure shown in FIG. 1 as an illustrative embodiment of the present invention includes two DFB modes on either side of a photonic gap. For reference, the two modes are referred to herein as a low-frequency mode and a high-frequency mode. Embodiments of the present invention selectively differentiate between the two modes by enhancing the losses for one mode more than the other mode.

Figure 3:
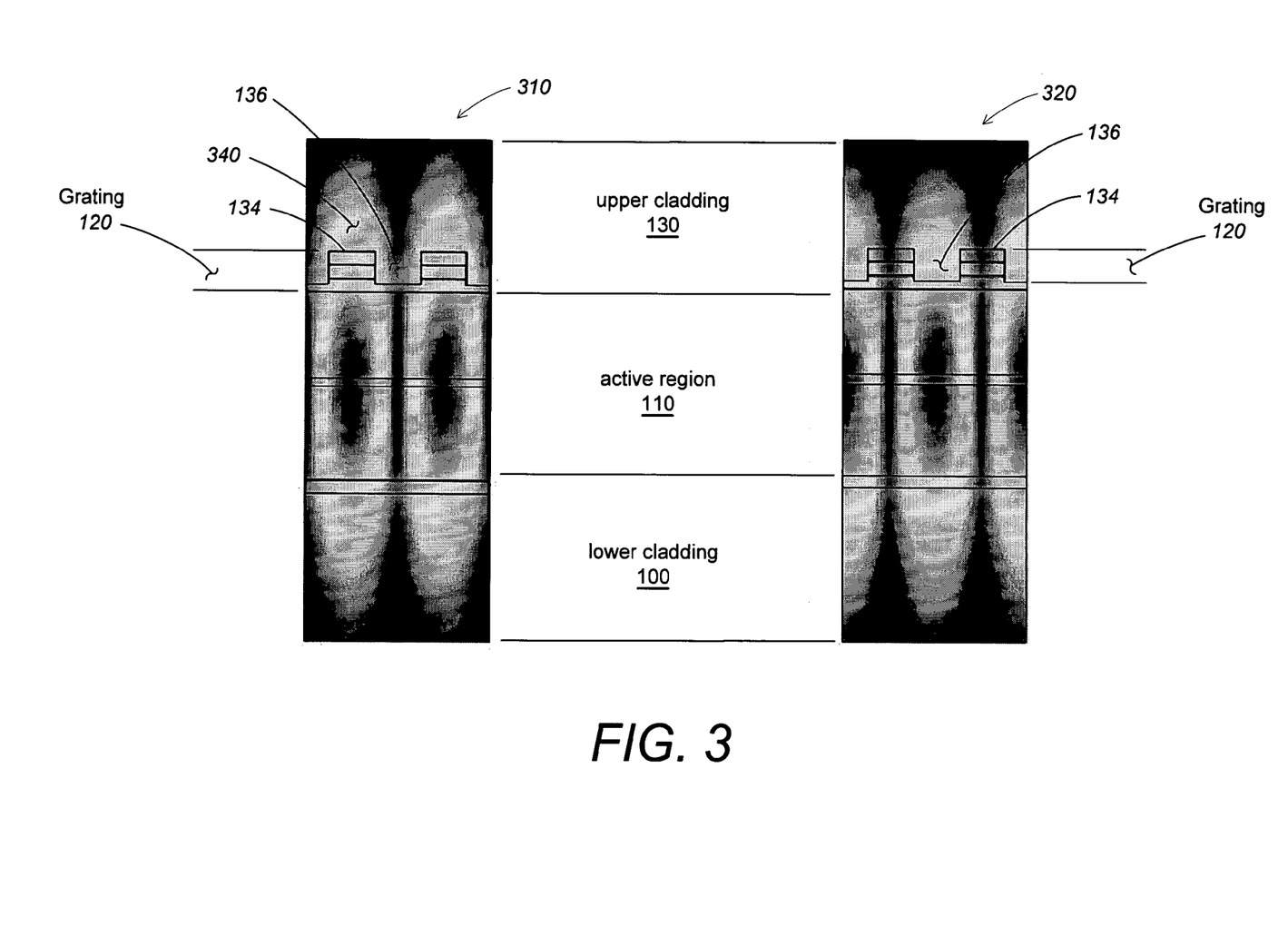
FIG. 3 shows the results of a simulation of an electric field magnitude for two frequency modes in a DFB-QCL structure according to some embodiments of the invention.

FIG. 3 shows the results of a simulation of the electric field magnitude for the low- and high-frequency modes in the exemplary DFB-QCL structure illustrated in FIG. 1. The simulation was performed using COMSOL 3.2 software. In FIG. 3, the plot 310 on the left corresponds to the low-frequency mode whereas the plot 320 on the right is for the high-frequency mode. The plots 310 and 320 show the electric field magnitude in a single period of the laser mode wavelength, which corresponds to two periods of the grating 120. In FIG. 3, a large electric field is represented by dark areas (e.g., region 330) in the center of the circles, whereas lighter gray areas (e.g., region 340) represent a negligible electric field.

As illustrated in FIG. 3, the low-frequency mode (plot 310) has greater electric-field amplitude in the higher refractive index portion of the grating (i.e., the ridges 134 of the grating 120), than the lower refractive index portion of the grating (i.e., the grooves 136 of the grating 120). In contrast, the high-frequency mode (plot 320) has greater electric field amplitude in the lower refractive index portion of the grating compared to the higher refractive index portion of the grating. The refractive index differences between the materials in the sections of the grating 120 give rise to the index-coupling of the DFB, and provide the difference in frequencies between the low- and high-frequency modes. In some embodiments, the degree of index-coupling present in the DFB may be adjusted by changing the amount of index contrast in the grating 120. This may be accomplished in any of a number of ways, for example, by choosing materials with a different amount of index contrast or by changing the thicknesses of the layers with different refractive indices.

In some embodiments, determining the amount of loss experienced by each of the two modes depends on the degree to which the electric-field amplitude is present in the lossy part of the grating 120 (e.g., the higher refractive index portion 134 in FIG. 3). As shown in FIG. 3, for the low frequency mode 310, there is some electric-field amplitude in the lossy part of the grating 120, whereas for the high-frequency mode 320, the amount of electric-field amplitude in the lossy part of the grating 120 is negligible. This spatial relationship between the modes causes the low-frequency mode to experience more losses than the high-frequency mode, resulting in a loss coupling of $\Delta\alpha/2$ in the DFB grating structure.

In some embodiments, the degree of loss-coupling present in the DFB may be adjusted by modifying one or more design parameters to alter the amount of loss contrast in the grating. For example, increasing the doping concentration and/or the thickness of the lossy material increases the loss-coupling in the grating, while also increasing the total waveguide loss (i.e., because there is some spatial overlap between the modes as illustrated in FIG. 3).

Although the exemplary illustration of FIGS. 1-3 describe a DFB grating design in which the low-frequency mode experiences more loss than the high-frequency mode, it should be appreciated that designing a grating structure where the high-frequency mode exhibits more loss than the low-frequency mode is also possible. For example, the DFB illustrated in FIGS. 1-3 and described above is designed to spatially align the high refractive-index part of the grating with the higher loss part of the grating. Designing a structure where the low-index part of the grating coincides spatially along the grating with the higher loss part of the grating is also contemplated by embodiments of the invention to allow the high-frequency mode to experience greater losses than the low-frequency mode.

Grating Parameters for Loss-Coupling

In some embodiments of the present invention, loss-coupling in the grating 120 may be varied by changing one or more design parameters of the grating. For example, the doping level of the lossy material 138, which affects the free-carrier absorption that results in the loss-coupling, may be varied. Other parameters which may also be varied in a DFB grating to affect the loss-coupling include, but are not limited to, the grating depth and the duty cycle of the grating.

In some embodiments, changing the depth of the grating 120 may be accomplished by changing the thickness of the highly-doped layer 138 with free-carrier absorptive losses. A thicker highly-doped layer 138 increases both the waveguide losses and the loss-coupling. Larger losses occur with a thicker layer of lossy material 138 because of a greater overlap of the lossy material with the mode of the laser. In some embodiments, the position of the highly-doped layer 138 with respect to the active region 110 may also be varied. For example, the lossy material 138 may be located either closer or further away from the active region 110 of the laser. Again, if the lossy material 138 is closer to the active region 110, the overlap of the lossy material 138 with the mode of the laser increases, leading to a larger effect on the total waveguide losses and the loss-coupling.

Figure 4:
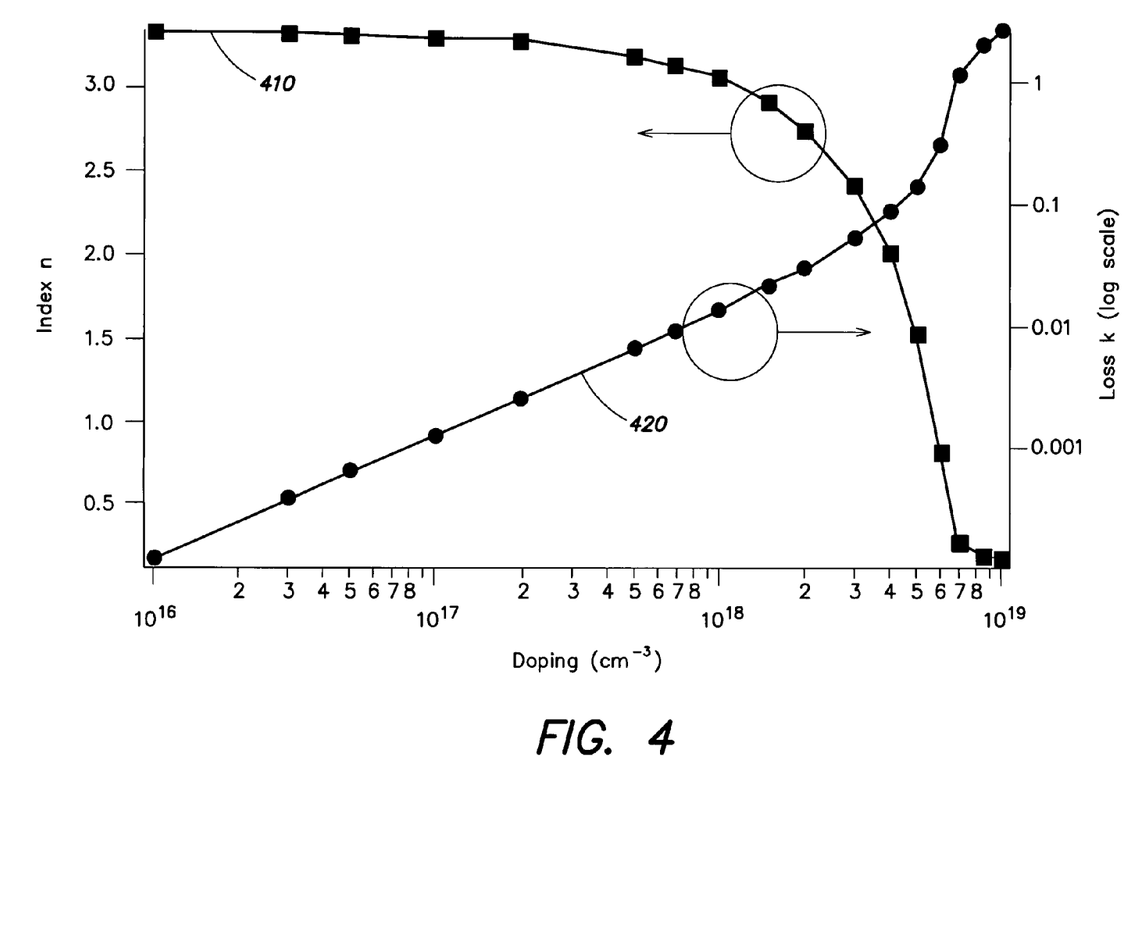
FIG. 4 is a diagram illustrating a relationship between a complex refractive index (refractive index and absorptive loss) of a doping agent and a doping level according to some embodiments of the invention.

Another design parameter that may be varied to obtain a desired loss in the grating 120 according to some embodiments of the invention is the doping level in the highly-doped layer 138 of the grating 120. FIG. 4 shows the results of a DFB-QCL simulation examining the dependence of complex refractive index n+i*k (refractive index and absorptive loss) of bulk InGaAs on the doping level. Accordingly, FIG. 4 illustrates an estimated range of the amount of loss experienced in materials having a certain doping level. The simulation of FIG. 4 was performed using suitable design parameters for a DFB-QCL, as discussed above, according to embodiments of the invention (e.g., mid-infrared radiation with a free-space wavelength of 9 μm).

In FIG. 4, the top curve 410 corresponds to the real part of the complex refractive index ("index") and the bottom curve 420 corresponds to the imaginary part ("loss"). As illustrated in FIG. 4, a large increase in loss and a corresponding decrease in the real index occurs as the doping level approaches $10^{19}$ cm$^{-3}$. At elevated doping levels, the plasma wavelength of InGaAs is decreased so that it is comparable to the wavelength of a mid-infrared laser. In general, in embodiments of the invention, the doping level may be selected to obtain a desired amount of loss due to free-carrier absorption.

Waveguide Losses of DFB Modes

As described above, one motivation for designing a grating with loss-coupling is to provide sufficient loss to differentiate the modes in the DFB-QCL and to enable reliable single-mode selection. However, we have appreciated that the waveguide loss for the desired lasing mode should be kept within reasonable limits. High losses for the desired lasing mode are detrimental to the laser performance, resulting in high threshold current, reduced output power, or no lasing at all. Thus, some embodiments of the invention are designed to achieve satisfactory loss-coupling without an excessive increase in the waveguide loss for the desired lasing mode.

Figure 5A:
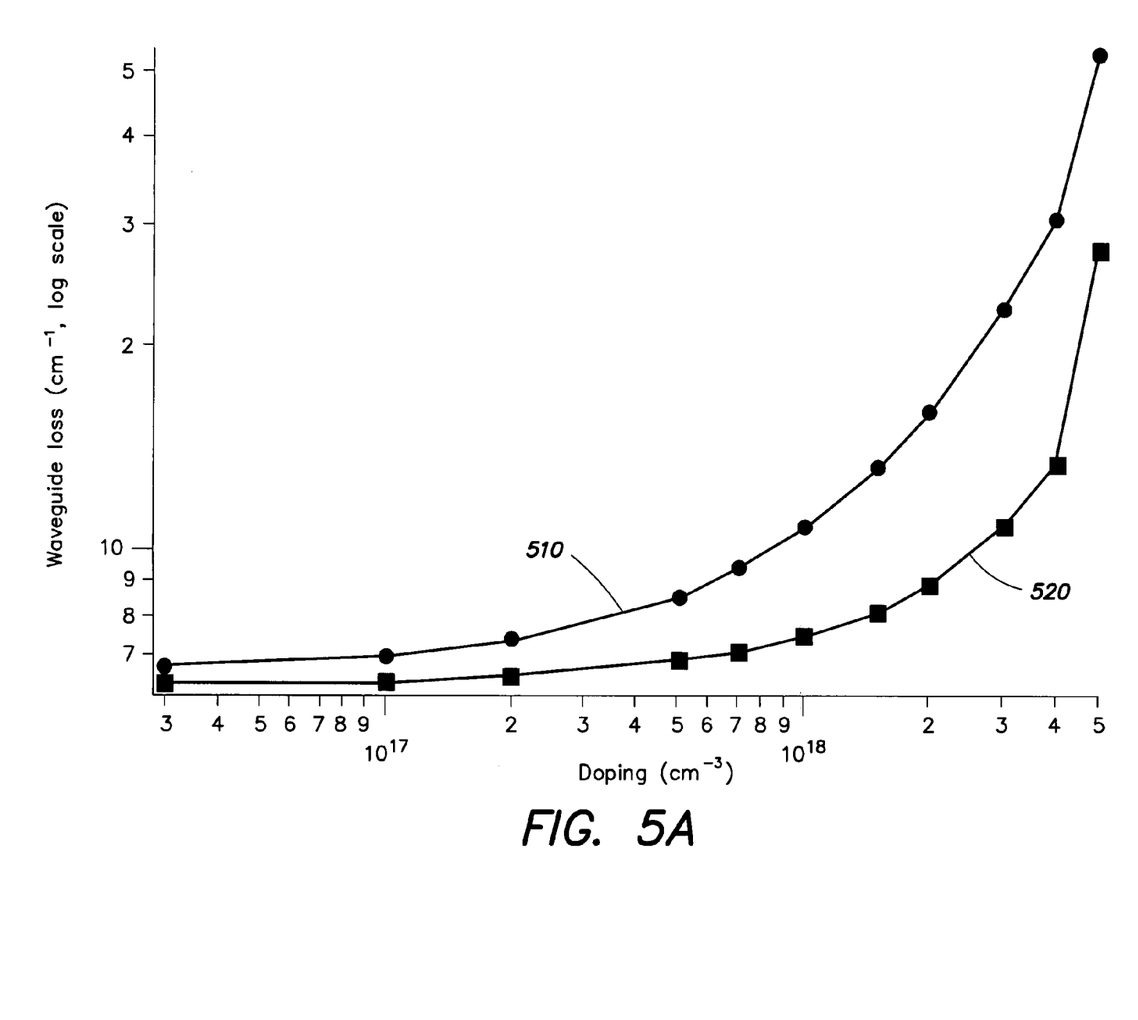
FIG. 5a is a diagram illustrating a relationship between waveguide loss in a simulated DFB-QCL structure according to some embodiments of the invention.

FIG. 5a shows results of a simulation of the waveguide loss at different doping levels for the low-frequency mode 510 and the high-frequency mode 520 for the DFB-QCL structure described in FIG. 1. The simulation was performed using COMSOL 3.2 software. In the simulation of FIG. 5a, the doping level in the lossy, highly-doped layer 138 of the DFB grating 120 was varied to determine the effects of doping level on the amount of loss for the low- and high-frequency DFB modes. As expected from the design of the DFB-QCL (see discussion of FIG. 3), the low-frequency mode exhibits a greater loss than the high-frequency mode. The amount of loss coupling present in the grating is equal to the difference between the losses of the low- and high-frequency modes. For example, in the design of FIGS. 1-3, the high-frequency mode is the "desired" mode (i.e., the high-frequency mode experiences fewer losses than the low-frequency mode).

As discussed above, in choosing an appropriate doping level for the lossy material 138, we have recognized and appreciated that both the amount of desired loss-coupling and the amount of waveguide loss that results for the desired lasing mode should be considered. In some embodiments, a minimum doping level is chosen to satisfy the desired amount of loss-coupling, so that the amount of waveguide loss for the desired laser mode is not too large. For example, referring to FIG. 5a, at a doping level of $10^{18}$ cm$^{-3}$, the loss-coupling is about 1.6 cm$^{-1}$, as the waveguide loss of the undesired low-frequency DFB mode is 10.8 cm$^{-1}$, whereas the waveguide loss is 7.5 cm$^{-1}$ for the desired high-frequency DFB mode. This amount of waveguide loss for the desired lasing mode is only slightly higher than if the DFB grating was not designed to incorporate loss-coupling (~6.5 cm$^{-1}$).

Figure 5B:
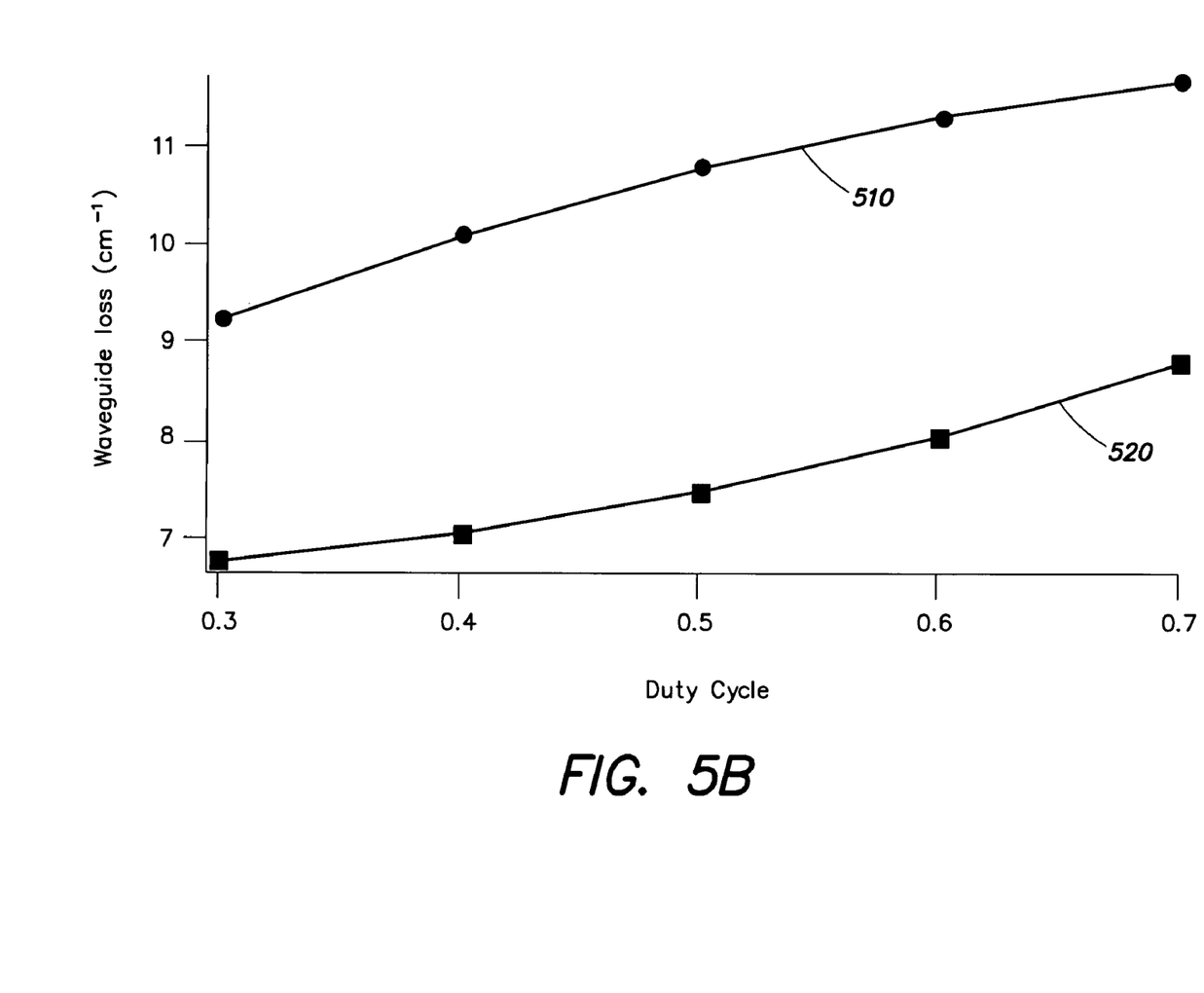
FIG. 5b is a diagram illustrating a relationship between waveguide loss and duty cycle of a grating in a simulated DFB-QCL structure according to some embodiments of the invention.

Another design parameter of the DFB grating 120 which affects waveguide loss is the duty cycle of the grating. FIG. 5b shows the results of a simulation of the waveguide loss for the low- and high-frequency DFB modes for the DFB-QCL structure described in FIG. 1, where the duty cycle of the grating was varied. In a grating with a low duty cycle, the width of the grating ridges containing the high-refractive index and highly-doped (lossy) layers is small compared to the width of the grating grooves containing the low-refractive index material. In a grating with a high-duty cycle, the design is exactly the opposite (i.e., wide grating ridges and narrow grating grooves).

In the simulation of FIG. 5b, the doping level of the highly-doped layer was fixed at $10^{18}$ cm$^{-3}$. The results of the simulation of FIG. 5b illustrate that for a low duty cycle, the losses of both the low-frequency mode 510 and the high-frequency mode 520 are lower than for a higher duty cycle. These results should not come as a surprise in that less lossy material is present for a low duty cycle grating compared to a high duty cycle grating.

DFB Coupling Coefficient

Figure 6A:
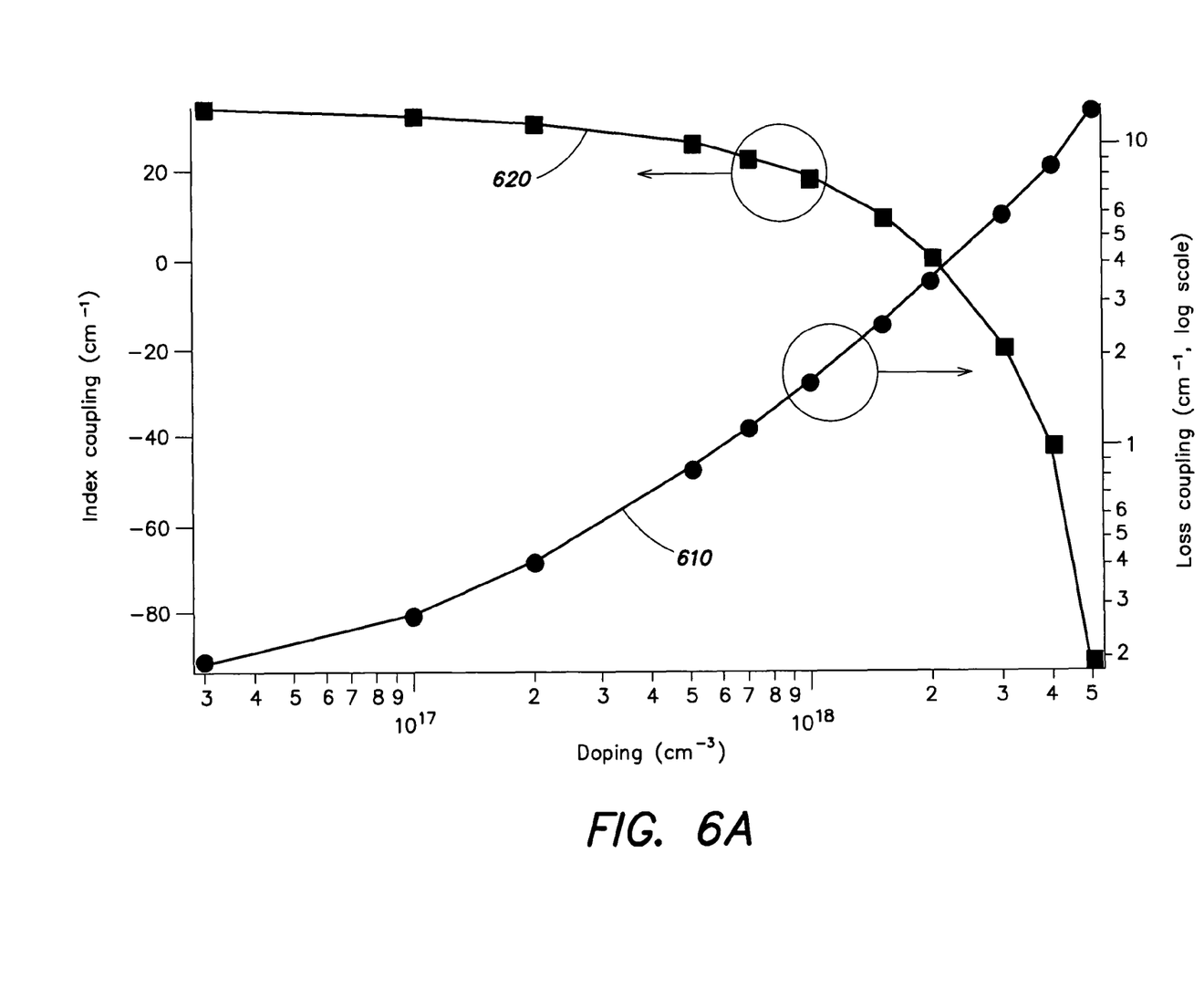
FIG. 6a is a diagram illustrating a relationship between coupling coefficients of a DFB grating and doping level for a simulated DFB-QCL structure according to some embodiments the invention.

FIG. 6a shows the results of a simulation of the real and imaginary part of a coupling coefficient k for the DFB-QCL structure described in FIG. 1. The simulation was performed using COMSOL 3.2 software.

As in FIG. 5a, the doping level in the lossy, highly-doped layer 138 of the grating 120 was varied in the simulation of FIG. 6a to determine how changes in doping level affect both loss-coupling 610 and index-coupling 620. As illustrated in FIG. 6a, as the doping level is increased up to a doping level of ~$10^{18}$ cm$^{-3}$, index-coupling 620 decreases slowly whereas the loss-coupling 610 increases rapidly. In contrast, as the doping level approaches $10^{19}$ cm$^{-3}$, both the index- and loss-coupling change dramatically.

In embodiments in which the complex-coupled DFB is desired to be primarily index-coupled, the region of FIG. 6a in which the doping varies between ~$10^{17}$ and $10^{18}$ cm$^{-3}$ may be most informative. In this region, the index-coupling 620 is large and relatively constant having values between 20-30 cm$^{-1}$ with the loss-coupling 610 increasing from 0.3 to 1.6 cm$^{-1}$. In the following discussion of FIG. 7, doping values in this region are further investigated to show that they may be appropriate for obtaining reliable single-mode selection in the DFB-QCL.

Figure 6B:
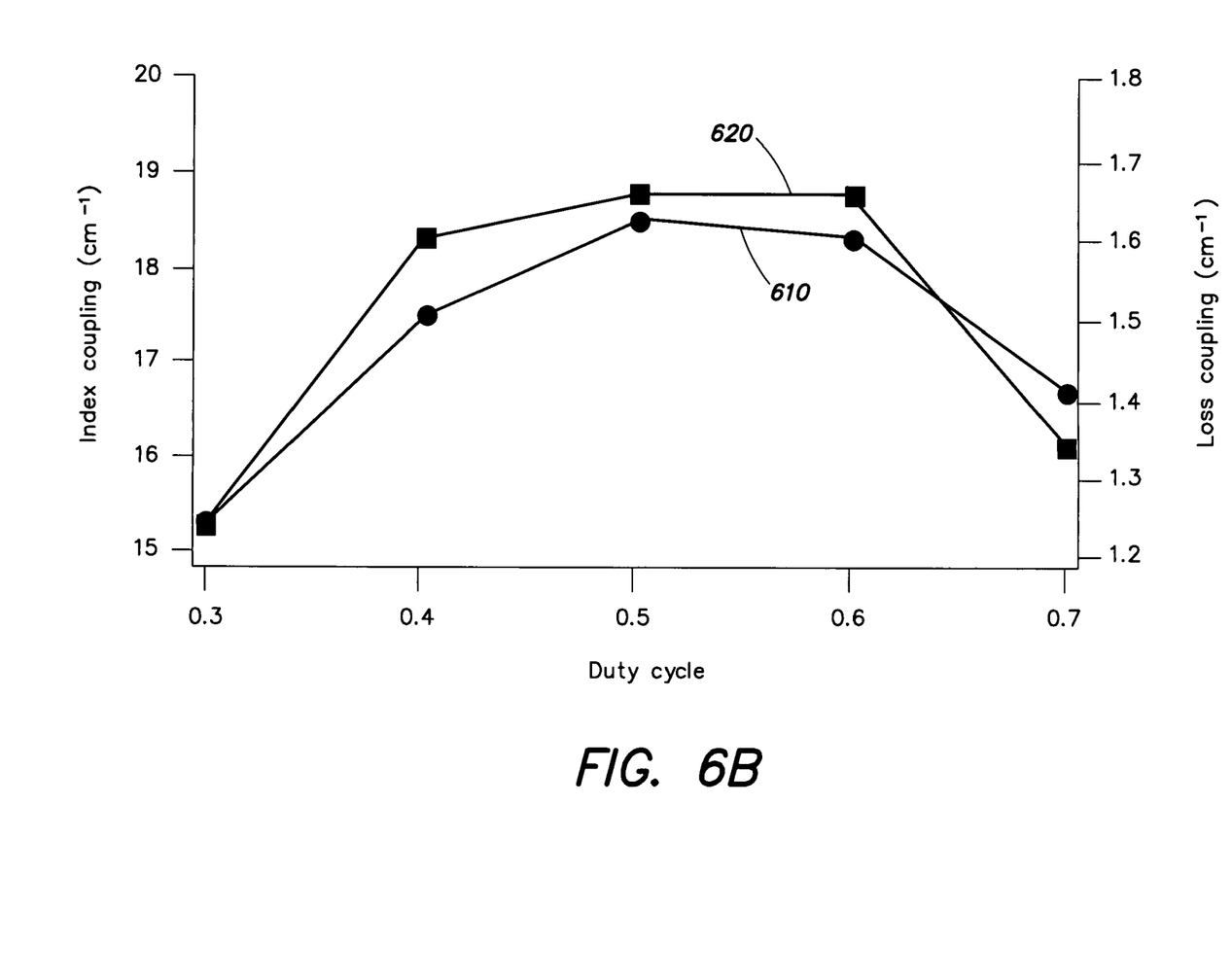
FIG. 6b is a diagram illustrating a relationship between coupling coefficients and duty cycle of a DFB grating for a simulated DFB-QCL structure according to some embodiments of the invention.

FIG. 6b shows the results of a simulation of the real and imaginary part of the coupling coefficient k for the DFB-QCL structure described in FIG. 1, in which the duty cycle of the grating 120 was varied to determine how changes in the duty cycle affect both loss-coupling 610 and index-coupling 620. As seen in FIG. 6b, DFB gratings with a duty cycle close to 50% yields results in maximum index- and loss-coupling in the grating.

Effects of End Facet Mirrors

The presence of end facet mirrors in QCLs generates reflections which constructively or destructively interfere with the DFB modes in the laser cavity. This interference affects the total loss of each mode, and can contribute to determining which mode is selected for lasing. For example, if the difference in waveguide losses between the modes is not large enough to consistently favor one mode over the other, selection of the lasing mode may depend on the location of the end mirrors in relation to the grating.

As described above, some embodiments of the invention are configured to reliably emit radiation in a particular desired mode, for example the high-frequency mode. Thus, in some embodiments, the DFB-QCL is designed such that the desired mode has lower total losses regardless of the presence of end mirrors by ensuring a sufficient amount of loss-coupling to outweigh any effect of the mirrors.

The inventors have recognized and appreciated that the effect of end mirrors is largest when the position of both mirrors coincide with a peak in electric-field amplitude of one DFB mode, which is also when the mirrors are at a node for the other DFB mode. When both mirrors coincide with the peaks, the reflections from the end mirrors maximally constructively interfere with the mode present in the laser cavity. This results in a lower total loss, due to the constructive contribution of the mirrors. Alternatively, when both mirrors coincide with the nodes, the reflections from the end mirrors destructively interfere with the mode present in the laser cavity. This results in a higher total loss, due to the destructive contribution of the mirrors.

Accordingly, in some embodiments, the DFB-QCL is designed to ensure that the desired mode has lower total losses even in the extreme case when the mirror position causes destructive interference for the desired mode and maximal constructive interference for the other, undesired mode.

Figure 7:
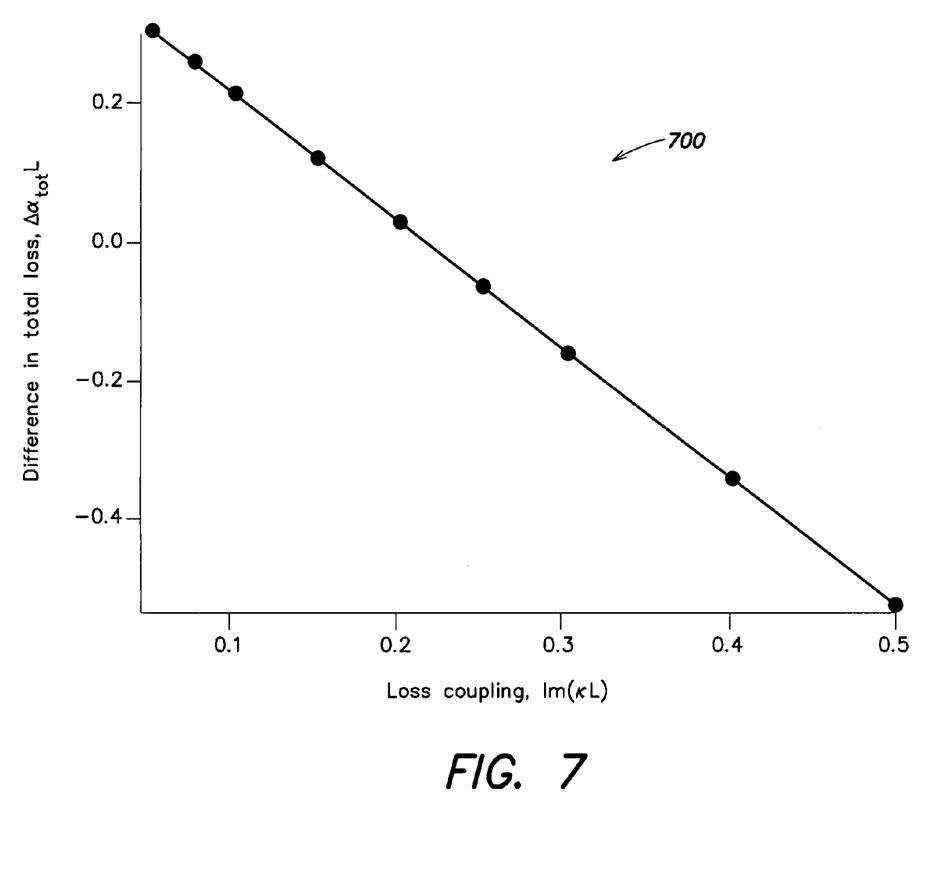
FIG. 7 is a diagram illustrating a relationship between total loss in two frequency modes of a simulated DFB-QCL structure according to some embodiments of the invention.

The plot 700 in FIG. 7 shows the difference in total loss for the low- and high-frequency modes of a DFB-QCL structure according to some embodiments of the invention. Plot 700 was calculated for a grating with $\kappa \cdot L \sim 4+i^*x$, where $\kappa$ is the coupling coefficient of the DFB, L is the length of the grating, and $\kappa \cdot L$ is a dimensionless number representing the strength of a DFB grating for a given L, and x is the loss-coupling term represented as the abscissa of plot 700. In the calculations of plot 700, the real part of the coupling Re($\kappa \cdot L$) was chosen to be 4, which is slightly over-coupled (critical coupling is $\kappa \cdot L \sim 1$), in order to have good suppression of higher-order DFB modes.

The inventors note that critical coupling ($\kappa \cdot L \sim 1$) corresponds to an even intensity distribution along the cavity for the mode, whereas over-coupled DFBs have the mode confined towards the center of the cavity and away from the end facets, due to the stronger grating. With highly over-coupled DFBs ($\kappa \cdot L \gg 1$), less light is output from the facets because of the mode confinement. Thus, there is a trade-off between having better suppression of higher-order DFB modes with larger coupling κ·L, and having greater light output with a weaker coupling.

In the example of FIG. 7, the reflectivity of the mirrors was chosen to be 30%, which corresponds to the dielectric/air interface at a cleaved (or etched) end mirror facet for a QCL. The y-axis of plot 700 denotes the difference between the total loss of the high- and low-frequency DFB modes. A negative difference indicates that the high-frequency DFB mode has the lower loss.

As illustrated in plot 700, the high-frequency DFB mode always has lower total loss, regardless of the end mirror positions, when the dimensionless loss-coupling Im(κ·L) is about 0.22 or greater. In embodiments where the QCL is 2 mm long, the value of Im(κ·L) corresponds to a loss-coupling Im(κ) of 1.1 $cm^{-1}$, while the dimensionless index-coupling Re(κ·L) of 4 is equivalent to Re(κ) of 20 $cm^{-1}$. From the data in FIG. 6, a doping level of approximately $7*10^{17}$ $cm^{-1}$ may be used for the lossy, highly-doped grating layer to achieve the desired results. In this exemplary embodiment, the waveguide losses are 9.4 $cm^{-1}$ for the undesired low-frequency DFB mode and 7.2 $cm^{-1}$ for the desired high-frequency DFB mode. and the amount of waveguide loss for the desired high-frequency DFB mode is only slightly higher than if the grating was not designed for loss-coupling (~6.5 $cm^{-1}$). The foregoing analysis demonstrates that in at least some embodiments of the invention, single-mode selection may be ensured even in the presence of end mirrors.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A distributed-feedback quantum cascade laser, comprising:
   an active region (110) to provide amplification of first radiation over a first range of wavelengths; and
   a distributed-feedback grating (120) disposed on the active region (110) to provide a spatial variation of free-carrier absorption loss such that the distributed-feedback quantum cascade laser supports substantially only a single mode of radiation emission.

2. The distributed-feedback quantum cascade laser of claim 1, wherein the distributed-feedback grating comprises a plurality of repeat units (132), wherein each repeat unit (132) comprises a first region (134) of a first semiconductor material and a second region (136) of a second semiconductor material.

3. The distributed-feedback quantum cascade laser of claim 2, wherein the first semiconductor material has a first refractive index and the second semiconductor material has a second refractive index which is different than the first refractive index.

4. The distributed-feedback quantum cascade laser of claim 2 or 3, wherein each of the plurality of repeat units (132) supports at least two frequency modes, and wherein the spatial variation of free-carrier absorption loss attenuates a first frequency mode of the at least two frequency modes more than a second frequency mode of the at least two frequency modes.

5. The distributed-feedback quantum cascade laser of claim 2, wherein the first region (134) further comprises a third region (140) having a first doping concentration, and a fourth region (138) having a second doping concentration, wherein the second doping concentration is greater than the first doping concentration.

6. The distributed-feedback quantum cascade laser of claim 2, wherein the first region (134) comprises doped InGaAs.

7. The distributed-feedback quantum cascade laser of claim 2, wherein the second region (136) comprises low-doped InP.

8. The distributed-feedback quantum cascade laser of claim 2, wherein the first region (134) and the second region (136) are respectively, high-doped and low-doped versions of the same semiconductor material.

9. The distributed-feedback quantum cascade laser of claim 1, wherein the single mode of radiation emission is in the mid-infrared range or the terahertz range.

10. The distributed-feedback quantum cascade laser of claim 1, wherein a duty cycle of the grating (120) is approximately 50%.

11. An array of semiconductor lasers, including a plurality of distributed-feedback quantum cascade lasers according to claim 1.

12. A system for infrared spectroscopy, comprising the array of semiconductor lasers of claim 11.

13. The array of claim 11 or the system of claim 12, wherein the array of semiconductor lasers are configured for gas and/or liquid chemical sensing.

14. A method for providing single-mode radiation emission, the method comprising:
   A) providing a spatial variation of free-carrier absorption loss in a quantum cascade laser such that the quantum cascade laser supports substantially only a single mode of radiation emission.

15. The method of claim 14, wherein A) comprises:
   disposing a distributed-feedback grating (120) on an active region (110) of a quantum cascade laser.

16. The method of claim 15, wherein the distributed-feedback grating (120) comprises at least two semiconductor materials having different doping levels.

17. The method of claim 16, wherein one of the at least two semiconductor materials with a higher doping level provides the spatial variation in free-carrier absorption loss.

18. The method of claim 15, wherein the distributed-feedback grating (120) comprises a single semiconductor material having spatially different doping levels.

19. The method of claim 18, wherein the spatially different doping levels provide the spatial variation in free-carrier absorption loss.

20. The method of claim 14, wherein A) comprises:
   configuring at least one of the following, each having significant intraband absorption:
      one or more quantum wells;
      one or more quantum wires; and
      one or more quantum dots,
   so as to provide the spatial variation of free-carrier absorption.

* * * * *